US009786240B2

(12) United States Patent
Zhao et al.

(10) Patent No.: US 9,786,240 B2
(45) Date of Patent: Oct. 10, 2017

(54) SCAN DRIVING CIRCUIT

(71) Applicant: WUHAN CHINA STAR OPTOELECTRONICS TECHNOLOGY CO. LTD., Hubei (CN)

(72) Inventors: Mang Zhao, Hubei (CN); Yong Tian, Hubei (CN); Shijuan Yi, Hubei (CN)

(73) Assignee: WUHAN CHINA STAR OPTOELECTRONICS TECHNOLOGY CO. LTD., Wuhan, Hubei (CN)

( * ) Notice: Subject to any disclaimer, the term of this patent is extended or adjusted under 35 U.S.C. 154(b) by 0 days.

(21) Appl. No.: 14/779,016

(22) PCT Filed: Aug. 10, 2015

(86) PCT No.: PCT/CN2015/086485
§ 371 (c)(1),
(2) Date: Sep. 22, 2015

(87) PCT Pub. No.: WO2017/000359
PCT Pub. Date: Jan. 5, 2017

(65) Prior Publication Data
US 2017/0004796 A1      Jan. 5, 2017

(30) Foreign Application Priority Data

Jul. 2, 2015   (CN) .......................... 2015 1 0381670

(51) Int. Cl.
*G09G 3/36*      (2006.01)
*G09G 3/20*      (2006.01)
*G11C 19/00*     (2006.01)

(52) U.S. Cl.
CPC ............. *G09G 3/3677* (2013.01); *G09G 3/20* (2013.01); *G11C 19/00* (2013.01);
(Continued)

(58) Field of Classification Search
None
See application file for complete search history.

(56) References Cited

U.S. PATENT DOCUMENTS

2005/0116967 A1*   6/2005   Shirasaki ............... G09G 3/325
                                                            345/690
2011/0150169 A1    6/2011   Lin et al.
(Continued)

FOREIGN PATENT DOCUMENTS

CN      104021750 A      9/2014
CN      104409054 A      3/2015
(Continued)

*Primary Examiner* — Kenneth B Lee, Jr.
(74) *Attorney, Agent, or Firm* — Mark M. Friedman (57) ABSTRACT

A scan driving circuit is provided. The scan driving circuit for driving cascaded scan lines includes a scan driving circuit, a latch module, a driving-signal generation module, an output control module, a high gate voltage source, and a low level gate voltage. The scan driving circuit of the present invention conducts a driving operation for the latch module by a first cascade signal and a second cascade signal, so that a clock signal is not required to be processed with a phase inversion, and thereby the scan driving circuit has less overall power consumption.

20 Claims, 4 Drawing Sheets

(52) U.S. Cl.
CPC ........... *G09G 2310/0267* (2013.01); *G09G 2310/0286* (2013.01); *G09G 2330/021* (2013.01)

(56) References Cited

U.S. PATENT DOCUMENTS

| | | | |
|---|---|---|---|
| 2015/0348596 A1* | 12/2015 | Yao | G09G 3/20 377/54 |
| 2016/0125828 A1 | 5/2016 | Xiao | |
| 2016/0125831 A1 | 5/2016 | Xiao | |
| 2016/0343323 A1 | 11/2016 | Xiao | |

FOREIGN PATENT DOCUMENTS

| | | |
|---|---|---|
| CN | 104464659 A | 3/2015 |
| CN | 104464663 A | 3/2015 |
| CN | 104700788 A | 6/2015 |

* cited by examiner

SCAN DRIVING CIRCUIT

BACKGROUND OF THE INVENTION

Field of the Invention

The present invention relates to display driver technology, and more particularly to a scan driving circuit.

Description of Prior Art

Gate Driver On Array (GOA), in which a scan driving circuit is fabricated on an array substrate of an existing thin film transistor liquid crystal display, carries out a driving manner of progressively scanning every scan line.

However, a conventional scan driving circuit requires the use of a clock signal CK and a clock signal XCK to conduct driving, and the clock signal CK and the clock signal XCK are opposite each other in phase. Thus, the clock signal CK for each cascaded stage in the conventional scan driving circuit must be processed with a phase inversion to obtain the clock signal XCK. Consequently, it results in a larger dynamic power consumption of the overall scan driving circuit.

Therefore, there is a need to provide a scanning driving circuit to solve the problems of the prior art.

SUMMARY OF THE INVENTION

An object of the present invention is to provide a scan driving circuit which has a simple structure and less power consumption.

To solve the foregoing problems, the present invention provides the following technical solutions.

According to an embodiment of the present invention, a scan driving circuit configured for driving cascaded scan lines is provided, the scan driving circuit comprises:

an input control module being inputted with a first dock signal of a current stage and cascade signals of a preceding stage, and for generating a control signal based on the first clock signal of the current stage and the cascade signals of the preceding stage;

a latch module for performing a latch operation for the control signal;

a driving-signal generation module for generating a driving signal based on the control signal and a second dock signal of the current stage;

an output control module for outputting a scanning signal of the current stage and a cascade signal of the current stage based on the driving signal;

a high gate voltage source for supplying a high voltage; and a low gate voltage source for supplying a low voltage;

wherein the cascade signals include a first cascade signal and a second cascade signal that are opposite in phase;

wherein the input control module comprises a first switching transistor, a second switching transistor, a third switching transistor, and a fourth switching transistor;

a control terminal of the first switching transistor is inputted with a first cascade signal of the preceding stage, an input terminal of the first switching transistor is connected to the high gate voltage source, and an output terminal of the first switching transistor is connected to an input terminal of the second switching transistor;

a control terminal of the second switching transistor is inputted with the first clock signal of the current stage, and an output terminal of the second switching transistor is respectively connected to an input terminal of the third switching transistor and an output terminal of the control signal;

a control terminal of the third switching transistor is inputted with the first clock signal of the current stage, and an output terminal of the third switching transistor is connected to an output terminal of the fourth switching transistor;

a control terminal of the fourth switching transistor is inputted with a second cascade signal of the preceding stage, and an input terminal of the fourth switching transistor is connected to the low gate voltage source;

wherein the latch module comprises a fifth switching transistor, a sixth switching transistor, a seventh switching transistor, and an eighth switching transistor;

an input terminal of the fifth switching transistor is connected to the high gate voltage source, and an output terminal of the fifth switching transistor is connected to the output terminal of the control signal;

a control terminal of the sixth switching transistor is connected to the control terminal of the fifth switching transistor, an input terminal of the sixth switching transistor is connected to the low gate voltage source, and an output terminal of the sixth switching transistor is connected to the output terminal of the control signal;

a control terminal of the seventh switching transistor is connected to the output terminal of the control signal, an input terminal of the seventh switching transistor is connected to the high gate voltage source, and an output terminal of the seventh switching transistor is connected to the control terminal of the fifth switching transistor; and a control terminal of the eighth switching transistor is connected to the output terminal of the control signal, an input terminal of the eighth switching transistor is connected to the low gate voltage source, and an output terminal of the eighth switching transistor is connected to the control terminal of the fifth switching transistor;

wherein the fifth switching transistor and the seventh switching transistor are PMOS transistors, and the sixth switching transistor and the eighth switching transistor are NMOS transistors.

In the scan driving circuit of the present invention, the first cascade signal of the preceding stage inputted to the scan driving circuit of the first stage is a start signal, and the second cascade signal of the preceding stage inputted to the scan driving circuit of the first stage is a phase-inverted signal of the start signal.

In the scan driving circuit of the present invention, the driving-signal generation module comprises a ninth switching transistor, a tenth switching transistor, an eleventh switching transistor, and a twelfth switching transistor;

a control terminal of the ninth switching transistor is connected to an output terminal of the latch module, an input terminal of the ninth switching transistor is connected to the high gate voltage source, and an output terminal of the ninth switching transistor is connected to an output terminal of the driving-signal generation module;

a control terminal of the tenth switching transistor is inputted with the second clock signal of the current stage, an input terminal of the tenth switching transistor is connected to the high gate voltage source, and an output terminal of the tenth switching transistor is connected to an output terminal of the driving-signal generation module;

a control terminal of the eleventh switching transistor is connected to the output terminal of the latch module, an input terminal of the eleventh switching transistor is connected to an output terminal of the twelfth switching transistor, and an output terminal of the eleventh switching transistor is connected to the output terminal of the driving-signal generation module; and a control terminal of the twelfth switching transistor is inputted with the second dock signal of the current stage, and an input terminal of the twelfth switching transistor is connected to the low gate voltage source;

wherein the ninth switching transistor and the tenth switching transistor are PMOS transistors, and the eleventh switching transistor and the twelfth switching transistor are NMOS transistors.

In the scan driving circuit of the present invention, the output terminal of the driving-signal generation module outputs a driving signal of the current stage, which is also the second cascade signal of the current stage.

In the scan driving circuit of the present invention, the output control module comprises a thirteenth switching transistor, a fourteenth switching transistor, a fifteenth switching transistor, a sixteenth switching transistor, a seventeenth switching transistor, and an eighteenth switching transistor;

a control terminal of the thirteenth switching transistor is connected to an output terminal of the drive signal generation module, an input terminal of the thirteenth switching transistor is connected to the high gate voltage source, and an output terminal of the thirteenth switching transistor is respectively connected to a control terminal of the fifteenth switching translator and a control terminal of the sixteenth switching transistor;

a control terminal of the fourteenth switching transistor is connected to the output terminal of the driving-signal generation module, an input terminal of the fourteenth switching transistor is connected to the low gate voltage source, and an output terminal of the fourteenth switching transistor is respectively connected to a control terminal of the fifteenth switching transistor and a control terminal of the sixteenth switching transistor;

an input terminal of the fifteenth switching transistor is connected to the high gate voltage source, and an output terminal of the fifteenth switching transistor is respectively connected to a control terminal of the seventeenth switching transistor and a control terminal of the eighteenth switching transistor;

an input terminal of the sixteenth switching transistor is connected to the low gate voltage source, and an output terminal of the sixteenth switching transistor is respectively connected to a control terminal of the seventeenth switching transistor and a control terminal of the eighteenth switching transistor;

an input terminal of the seventeenth switching transistor is connected to the high gate voltage source, and an output terminal of the seventeenth switching transistor is connected to an output terminal of the output control module; and an input terminal of the eighteenth switching transistor is connected to a low gate voltage source, and an output terminal of the eighteenth switching transistor is connected to the output terminal of the output control module;

wherein the thirteen switching transistor, the fifteenth switching transistor, and the seventeenth switching transistor are PMOS transistors, and the fourteenth switching transistor, the sixteenth switching transistor, and the eighteenth switching transistor are NMOS transistors.

In the scan driving circuit of the present invention, the output terminal of the thirteenth switching transistor outputs the first cascade signal of the current stage.

In the scan driving circuit of the present invention, the first switching transistor, the second switching transistor, the third switching transistor, and the fourth switching transistor are all NMOS transistors or PMOS transistors.

In the scan driving circuit of the present invention, the first switching transistor and the fourth switching transistor are both NMOS transistors, and the second switching transistor and the third switching transistor are both PMOS transistors.

In the scan driving circuit of the present invention, the first switching transistor and the fourth switching transistor are both PMOS transistors, and the second switching transistor and the third switching transistor are both NMOS transistors.

According to another embodiment of the present invention, a scan driving circuit configured for driving cascaded scan lines is provided, the scan driving circuit comprises:

an input control module being inputted with a first clock signal of a current stage and cascade signals of a preceding stage, and for generating a control signal based on the first clock signal of the current stage and the cascade signals of the preceding stage;

a latch module for performing a latch operation for the control signal;

a driving-signal generation module for generating a driving signal based on the control signal and a second clock signal of the current stage;

an output control module for outputting a scanning signal of the current stage and a cascade signal of the current stage based on the driving signal;

a high gate voltage source for supplying a high voltage; and a low gate voltage source for supplying a low voltage.

In the scan driving circuit of the present invention, the cascade signals include a first cascade signal and a second cascade signal that are opposite in phase;

the input control module comprises a first switching transistor, a second switching transistor, a third switching transistor, and a fourth switching transistor;

a control terminal of the first switching transistor is inputted with a first cascade signal of the preceding stage, an input terminal of the first switching transistor is connected to the high gate voltage source, and an output terminal of the first switching transistor is connected to an input terminal of the second switching transistor;

a control terminal of the second switching transistor is inputted with the first clock signal of the current stage, and an output terminal of the second switching transistor is respectively connected to an input terminal of the third switching transistor and an output terminal of the control signal;

a control terminal of the third switching transistor is inputted with the first clock signal of the current stage, and an output terminal of the third switching transistor is connected to an output terminal of the fourth switching transistor;

a control terminal of the fourth switching transistor is inputted with a second cascade signal of the preceding stage, and an input terminal of the fourth switching transistor is connected to the low gate voltage source.

In the scan driving circuit of the present invention, the first cascade signal of the preceding stage inputted to the scan driving circuit of the first stage is a start signal, and the second cascade signal of the preceding stage inputted to the scan driving circuit of the first stage is a phase-inverted signal of the start signal.

In the scan driving circuit of the present invention, the latch module comprises a fifth switching transistor, a sixth switching transistor, a seventh switching transistor, and an eighth switching transistor;
- an input terminal of the fifth switching transistor is connected to the high gate voltage source, and an output terminal of the fifth switching transistor is connected to the output terminal of the control signal;
- a control terminal of the sixth switching transistor is connected to the control terminal of the fifth switching transistor, an input terminal of the sixth switching transistor is connected to the low gate voltage source, and an output terminal of the sixth switching transistor is connected to the output terminal of the control signal;
- a control terminal of the seventh switching transistor is connected to the output terminal of the control signal, an input terminal of the seventh switching transistor is connected to the high gate voltage source, and an output terminal of the seventh switching transistor is connected to the control terminal of the fifth switching transistor; and
- a control terminal of the eighth switching transistor is connected to the output terminal of the control signal, an input terminal of the eighth switching transistor is connected to the low gate voltage source, and an output terminal of the eighth switching transistor is connected to the control terminal of the fifth switching transistor;
- wherein the fifth switching transistor and the seventh switching transistor are PMOS transistors, and the sixth switching transistor and the eighth switching transistor are NMOS transistors.

In the scan driving circuit of the present invention, the driving-signal generation module comprises a ninth switching transistor, a tenth switching transistor, an eleventh switching transistor, and a twelfth switching transistor;
- a control terminal of the ninth switching transistor is connected to an output terminal of the latch module, an input terminal of the ninth switching transistor is connected to the high gate voltage source, and an output terminal of the ninth switching transistor is connected to an output terminal of the driving-signal generation module;
- a control terminal of the tenth switching transistor is inputted with the second clock signal of the current stage, an input terminal of the tenth switching transistor is connected to the high gate voltage source, and an output terminal of the tenth switching transistor is connected to an output terminal of the driving-signal generation module;
- a control terminal of the eleventh switching transistor is connected to the output terminal of the latch module, an input terminal of the eleventh switching transistor is connected to an output terminal of the twelfth switching transistor, and an output terminal of the eleventh switching transistor is connected to the output terminal of the driving-signal generation module; and
- a control terminal of the twelfth switching transistor is inputted with the second clock signal of the current stage, and an input terminal of the twelfth switching transistor is connected to the low gate voltage source;
- wherein the ninth switching transistor and the tenth switching transistor are PMOS transistors, and the eleventh switching transistor and the twelfth switching transistor are NMOS transistors.

In the scan driving circuit of the present invention, the output terminal of the driving-signal generation module outputs a driving signal of the current stage, which is also the second cascade signal of the current stage.

In the scan driving circuit of the present invention, the output control module comprises a thirteenth switching transistor, a fourteenth switching transistor, a fifteenth switching transistor, a sixteenth switching transistor, a seventeenth switching transistor, and an eighteenth switching transistor;
- a control terminal of the thirteenth switching transistor is connected to an output terminal of the drive signal generation module, an input terminal of the thirteenth switching transistor is connected to the high gate voltage source, and an output terminal of the thirteenth switching transistor is respectively connected to a control terminal of the fifteenth switching transistor and a control terminal of the sixteenth switching transistor;
- a control terminal of the fourteenth switching transistor is connected to the output terminal of the driving-signal generation module, an input terminal of the fourteenth switching transistor is connected to the low gate voltage source, and an output terminal of the fourteenth switching transistor is respectively connected to a control terminal of the fifteenth switching transistor and a control terminal of the sixteenth switching transistor;
- an input terminal of the fifteenth switching transistor is connected to the high gate voltage source, and an output terminal of the fifteenth switching transistor is respectively connected to a control terminal of the seventeenth switching transistor and a control terminal of the eighteenth switching transistor;
- an input terminal of the sixteenth switching transistor is connected to the low gate voltage source, and an output terminal of the sixteenth switching transistor is respectively connected to a control terminal of the seventeenth switching transistor and a control terminal of the eighteenth switching transistor;
- an input terminal of the seventeenth switching transistor is connected to the high gate voltage source, and an output terminal of the seventeenth switching transistor is connected to an output terminal of the output control module; and
- an input terminal of the eighteenth switching transistor is connected to a low gate voltage source, and an output terminal of the eighteenth switching transistor is connected to the output terminal of the output control module;
- wherein the thirteen switching transistor, the fifteenth switching transistor, and the seventeenth switching transistor are PMOS transistors, and the fourteenth switching transistor, the sixteenth switching transistor, and the eighteenth switching transistor are NMOS transistors.

In the scan driving circuit of the present invention, the output terminal of the thirteenth switching transistor outputs the first cascade signal of the current stage.

In the scan driving circuit of the present invention, the first switching transistor, the second switching transistor, the third switching transistor, and the fourth switching transistor are all NMOS transistors or PMOS transistors.

In the scan driving circuit of the present invention, the first switching transistor and the fourth switching transistor are both NMOS transistors, and the second switching transistor and the third switching transistor are both PMOS transistors.

In the scan driving circuit of the present invention, the first switching transistor and the fourth switching transistor are both PMOS transistors, and the second switching transistor and the third switching transistor are both NMOS transistors.

To allow the foregoing summary of the present invention to be more clearly understood, there are preferred embodiments, which proceed with reference to the accompanying drawings, and are described in detail as follows.

DETAILED DESCRIPTION OF THE INVENTION

The preferred embodiments of the present invention will be detailed in the following in combination with the accompanying drawings. The drawings are drawn schematically, and do not limit the protection scope thereof, and the same reference numbers are used to indicate the same or similar components throughout the drawings. Spatially relative terms, such as "above", "beneath", "front", "behind", "left", "right", "inner", "outer", and the like may be used herein for reference to describe one element's relationship to another element(s) as illustrated in the figures, rather than its restrictions.

In the drawings, units having similar structural elements are indicated with the same reference numerals.

Figure 1:
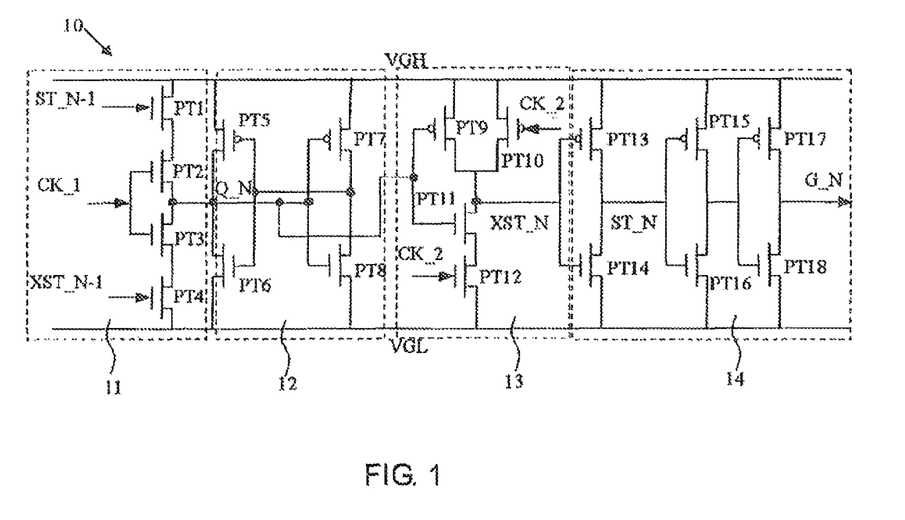
FIG. 1 is a schematic diagram of a scan driving circuit in accordance with the first embodiment of the present invention.

Refer to FIG. 1, which is a schematic diagram of a scan driving circuit in accordance with the first embodiment of the present invention. The scan driving circuit of the present preferred embodiment is for driving cascaded scan lines, a scan driving circuit 10 for each stage includes an input control module 11, a latch module 12, a driving-signal generation module 13, an output control module 14, a high gate voltage source VGH, and a low level gate voltage VGL.

The input control module 11 is inputted with a first dock signal of a current stage CK_1 and cascade signals of a preceding stage, and then a control signal Q_N is generated based on the first clock signal of the current stage CK_1 and the cascade signals of the preceding stage. The latch module 12 is configured for performing a latch operation for the control signal Q_N. The driving-signal generation module 13 is configured for generating a driving signal based on the control signal Q_N and a second clock signal of the current stage CK_2. The output control module 14 is configured for outputting a scanning signal of the current stage G_N and a cascade signal of the current stage based on the driving signal. The high gate voltage source VGH is configured for supplying a high voltage. The low gate voltage source VGL is configured for supplying a low voltage.

The cascade signals include a first cascade signal ST_N and a second cascade signal XST_N, and the first cascade signal ST_N and the second cascade signal XST_N are opposite in phase.

In the first embodiment, the input control module 11 includes a first switching transistor PT1, a second switching transistor PT2, a third switching transistor PT3, and a fourth switching transistor PT4.

A control terminal of the first switching transistor PT1 is inputted with a first cascade signal of the preceding stage ST_N−1. An input terminal of the first switching transistor PT1 is connected to a high gate voltage source VGH. An output terminal of the first switching transistor PT1 is connected to an input terminal of the second switching transistor PT2.

A control terminal of the second switching transistor PT2 is inputted with the first clock signal of the current stage CK_1, and an output terminal of the second switching transistor PT2 is, respectively, connected to an input terminal of the third switching transistor PT3 and an output terminal of the control signal.

A control terminal of the third switching transistor PT3 is inputted with the first clock signal of the current stage CK_1, and an output terminal of the third switching transistor PT3 is connected to an output terminal of the fourth switching transistor PT4.

A control terminal of the fourth switching transistor PT4 is inputted with a second cascade signal of the preceding stage XST_N−1, and an input terminal of the fourth switching transistor PT4 is connected to the low gate voltage source VGL.

In the first embodiment, the latch module 12 includes a fifth switching transistor PT5, a sixth switching transistor PT6, a seventh switching transistor PT7, and an eighth switching transistor PT8.

An input terminal of the fifth switching transistor PT5 is connected to the high gate voltage source VGH, and an output terminal of the fifth switching transistor PT5 is connected to the output terminal of the control signal.

A control terminal of the sixth switching transistor PT6 is connected to the control terminal of the fifth switching transistor PT5. An input terminal of the sixth switching transistor PT6 is connected to the low gate voltage source VGL. An output terminal of the sixth switching transistor PT6 is connected to the output terminal of the control signal.

A control terminal of the seventh switching transistor PT7 is connected to the output terminal of the control signal. An input terminal of the seventh switching transistor PT7 is connected to the high gate voltage source VGH, and an output terminal of the seventh switching transistor PT7 is connected to the control terminal of the fifth switching transistor PT5.

A control terminal of the eighth switching transistor PT8 is connected to the output terminal of the control signal. An input terminal of the eighth switching transistor PT8 is connected to the low gate voltage source VGL, and an output terminal of the eighth switching transistor PT8 is connected to a control terminal of the fifth switching transistor PT5.

In the first embodiment, the driving-signal generation module 13 includes a ninth switching transistor PT9, a tenth switching transistor PT10, an eleventh switching transistor PT1, and a twelfth switching transistor PT12.

A control terminal of the ninth switching transistor PT9 is connected to an output terminal of the latch module 12. An input terminal of the ninth switching transistor PT9 is connected to the high gate voltage source VGH, and an output terminal of the ninth switching transistor PT9 is connected to an output terminal of the driving-signal generation module 13.

A control terminal of the tenth switching transistor PT10 is inputted with the second clock signal of the current stage CK_2. An input terminal of the tenth switching transistor PT10 is connected to the high gate voltage source VGH. An output terminal of the tenth switching transistor PT10 is connected to an output terminal of the driving-signal generation module 13.

A control terminal of the eleventh switching transistor PT11 is connected to the output terminal of the latch module 12. An input terminal of the eleventh switching transistor PT11 is connected to an output terminal of the twelfth switching transistor PT12. An output terminal of the eleventh switching transistor PT11 is connected to the output terminal of the driving-signal generation module 13.

A control terminal of the twelfth switching transistor PT12 is inputted with the second clock signal of the current stage CK_2, and an input terminal of the twelfth switching transistor PT12 is connected to the low gate voltage source VGL.

In the first embodiment, the output control module 14 includes a thirteenth switching transistor PT13, a fourteenth switching transistor PT14, a fifteenth switching transistor PT15, a sixteenth switching transistor PT16, a seventeenth switching transistor PT17, and an eighteenth switching transistor PT18.

A control terminal of the thirteenth switching transistor PT13 is connected to an output terminal of the drive signal generation module 13. An input terminal of the thirteenth switching transistor PT13 is connected to the high gate voltage source VGH. An output terminal of the thirteenth switching transistor PT13 is respectively connected to a control terminal of the fifteenth switching transistor PT15 and a control terminal of the sixteenth switching transistor PT16.

A control terminal of the fourteenth switching transistor PT14 is connected to the output terminal of the driving-signal generation module 13. An input terminal of the fourteenth switching transistor PT14 is connected to the low gate voltage source VGL. An output terminal of the fourteenth switching transistor PT14 is, respectively, connected to a control terminal of the fifteenth switching transistor PT15 and a control terminal of the sixteenth switching transistor PT16.

An input terminal of the fifteenth switching transistor PT15 is connected to the high gate voltage source VGH, and an output terminal of the fifteenth switching transistor PT15 is, respectively, connected to a control terminal of the seventeenth switching transistor PT17 and a control terminal of the eighteenth switching transistor PT18.

An input terminal of the sixteenth switching transistor PT16 is connected to the low gate voltage source VGL, and an output terminal of the sixteenth switching transistor PT16 is, respectively, connected to a control terminal of the seventeenth switching transistor PT17 and a control terminal of the eighteenth switching transistor PT18.

An input terminal of the seventeenth switching transistor PT17 is connected to the high gate voltage source VGH, and an output terminal of the seventeenth switching transistor PT17 is connected to an output terminal of the output control module 14.

An input terminal of the eighteenth switching transistor PT18 is connected to the low gate voltage source VGL, and an output terminal of the eighteenth switching transistor PT18 is connected to the output terminal of the output control module 14.

In the first embodiment, the first switching transistor PT1, the second switching transistor PT2, the third switching transistor PT3, and the fourth switching transistor PT4 are all NMOS transistors. The fifth switching transistor PT5 and the seventh switching transistor PT7 are PMOS transistors, while the sixth switching transistor PT6 and the eighth switching transistor PT8 are NMOS transistors. The ninth switching transistor PT9 and the tenth switching transistor PT10 are PMOS transistors, while the eleventh switching transistor PT11 and the twelfth switching transistor PT12 are NMOS transistors. The thirteen switching transistor PT13, the fifteenth switching transistor PT15, and the seventeenth switching transistor PT17 are PMOS translators, while the fourteenth switching transistor PT14, the sixteenth switching transistor PT16, and the eighteenth switching transistor PT18 are NMOS transistors.

Figure 2:
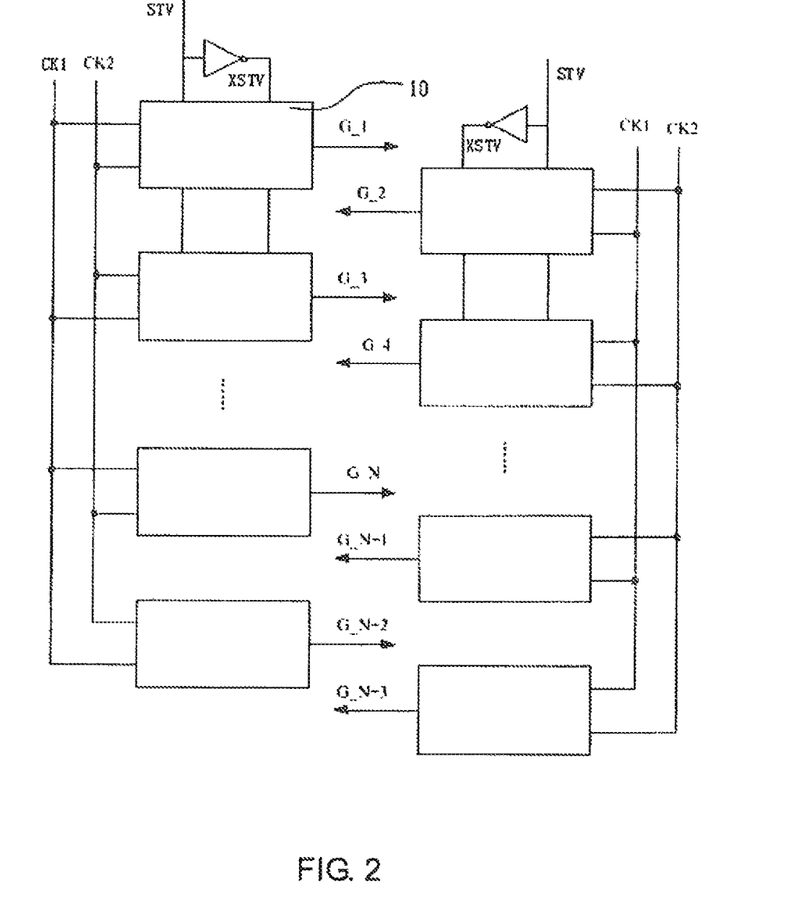
FIG. 2 is a schematic diagram of a cascade structure for the scan driving circuits in accordance with the first embodiment of the present invention.
Figure 3:
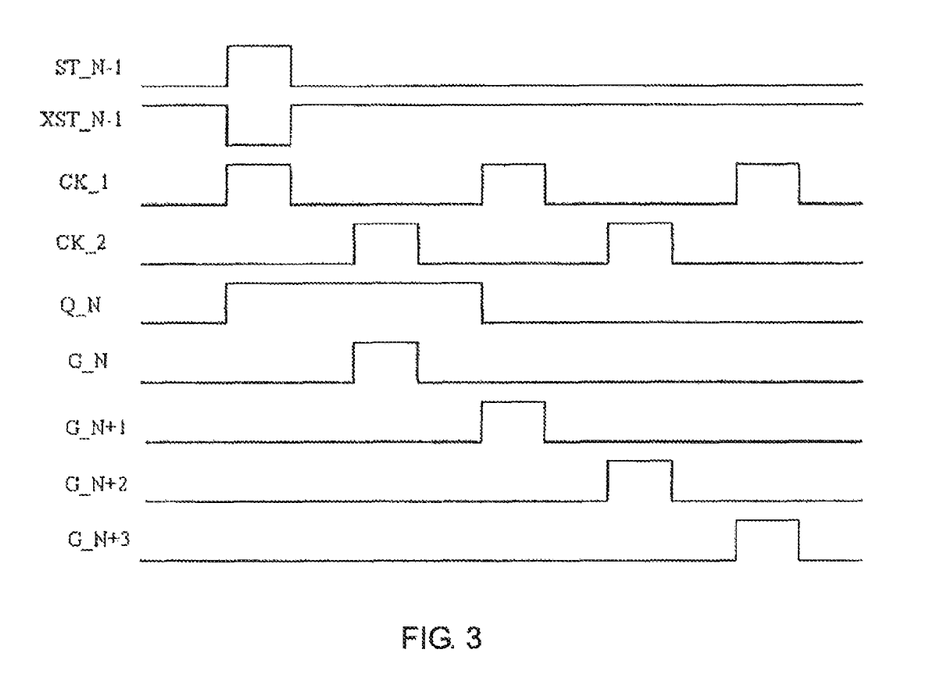
FIG. 3 is a signal waveform diagram depicting the scan driving circuits in accordance with the first embodiment of the present invention.

When the scan driving circuit of the present preferred embodiment is in operation, referring to FIG. 1 to FIG. 3, FIG. 2 is a schematic diagram of a cascade structure for the scan driving circuits in accordance with the first embodiment of the present invention, and FIG. 3 is a signal waveform diagram depicting the scan driving circuits in accordance with the first embodiment of the present invention.

A start signal STV in the scan driving circuit of the first stage is used to replace the first cascade signal of the preceding stage ST_N−1, and a phase-inverted signal of the start signal XSTV formed by the first cascade signal and an Inverter is used to replace the second cascade signal of the preceding stage XST_N−1. As shown in FIG. 3, when the first cascade signal of the preceding stage ST_N−1 is at the high level, the second cascade signal of the preceding stage XST_N−1 is at the low level. Also, the first clock signal of the current stage CK_1 is at the high level. At this point, the first switching transistor PT1, the second switching transistor PT2, and the third switching transistor PT3 are turned on while the fourth switching transistor PT4 is turned off. A high-level control signal is outputted from the output terminal of the control signal by applying a high-level voltage of the high gate voltage source VGH that goes through the first switching transistor PT1 and the second switching translator PT2. An output terminal of the control signal and the low gate voltage source VGL are disconnected by the fourth switching transistor PT4.

Subsequently, the first clock signal of the current stage CK_1 becomes the low level, and the second switching transistor PT2 and the third switching transistor PT3 are turned off. The high-level control signal outputted from the output terminal of the control signal of the input control module 11 is latched by the latch module 12. Specifically, the eighth switching transistor PT8 is turned on by applying the high-level control signal, while the sixth switching transistor PT6 is turned off by applying the high-level control signal. In this manner, the low-level voltage of the low gate voltage source VGL is applied to the control terminal of the fifth switching transistor PT5 and the control terminal of the seventh switching transistor PT7 by going through the eighth switching transistor PT8. The fifth switching transistor PT5 is turned on by applying the low-level voltage while the seventh switching transistor PT7 is turned off by applying the low-level voltage. The high-level voltage of the high gate voltage source VGH is applied to the control signal Q_N by going through the fifth switching transistor PT5, so that the control signal Q_N may remain at the high level until the second switching transistor PT2 and the third switching transistor PT3 are turned on when the first clock signal of the current stage CK_1 becomes at the high level. At this point, the control signal Q_N is turned to be at the low level.

The driving-signal generation module 13 conducts a NAND operation between the control signal Q_N outputted by the latch module 12 and the second clock signal of the current stage CK_2. Specifically, when the control signal Q_N and the second clock signal of the current stage CK_2 are both at the high level, the ninth switching transistor PT9 and the tenth switching transistor PT10 are turned off while the eleventh switching transistor PT11 and the twelfth switching transistor PT12 are turned on. At this point, the output terminal of the driving-signal generation module 13 outputs the low-level voltage of the low gate voltage source VGL. However, when the second clock signal of the current stage CK_2 is at the low level, the twelfth switching transistor PT12 is turned off, but the tenth switching transistor PT10 is turned on. At this point, the output terminal of the driving-signal generation module 13 outputs the high-level voltage of the high gate voltage source VGH. Alternatively, when the control signal Q_N is at a low level, the ninth switching transistor PT9 is turned on, but the eleventh switching transistor PT11 is turned off. At this point, the output terminal of the driving-signal generation module 13 outputs the high-level voltage of the high gate voltage source VGH.

An output terminal of the driving-signal generation module 13 outputs a driving signal, which acts as a second cascade signal of the current stage XST_N to output to a scan driving circuit of a succeeding stage. An output terminal of the thirteenth switching transistor PT13 outputs the first cascade signal of the current stage ST_N to the scan driving circuit of the succeeding stage.

When the driving signal is at the high level, the fourteenth switching transistor PT14 is turned on, but the thirteenth switching transistor PT13 is turned off. The low-level voltage of the low gate voltage source VGL is inputted to the control terminal of the fifteenth switching transistor PT15 and the control terminal of the sixteenth switching transistor PT16. The fifteenth switch PT15 is turned on, but the sixteenth switching transistor PT16 is turned off. The high-level voltage of the high gate voltage source VGH is inputted to the control terminal of input to seventeenth switching transistor PT17 and the control terminal of the eighteenth switching transistor PT18. The seventeenth switching transistor PT17 is turned off, but the eighteenth switching transistor PT18 is turned on. The output control module 14 outputs the scanning signal of the current stage G_N at a low level.

When the driving signal is at the low level, the fourteenth switching transistor PT14 is turned off, but the thirteenth switching transistor PT13 is turned on. The high-level voltage of the high gate voltage source VGH is inputted to the control terminal of the fifteenth switching transistor PT15 and the control terminal of the sixteenth switching transistor PT16. The fifteenth switch PT15 is turned off, but the sixteenth switching transistor PT16 is turned on. The low-level voltage of the low gate voltage source VGL is inputted to the control terminal of input to seventeenth switching transistor PT17 and the control terminal of the eighteenth switching transistor PT18. The seventeenth switching transistor PT17 is turned on, but the eighteenth switching transistor PT18 is turned off. The output control module 14 outputs a scanning signal of the current stage G_N at the high level.

Referring to FIG. 2, in the first embodiment, the odd-numbered scanning lines are cascaded to each other, and the even-numbered scanning lines are cascaded to each other. The first clock signal CK_1 of the scan driving circuit 10 of the odd-numbered scanning lines has the same phase as the second clock signal CK_2 of the scan driving circuit of the even-numbered scanning lines. Furthermore, the second clock signal CK_2 of the scan driving circuit of the odd-numbered scanning lines has the same phase as the first clock signal CK_1 of the scan driving circuit of the even-numbered scanning lines. Consequently, the scanning signal of the current stage G_N and the second succeeding scanning signal G_N+2 respectively correspond to the second clock signal CK_2 that is at the high level, and the first succeeding scanning signal G_N+1 and the third succeeding scanning signal G_N+3 respectively correspond to the first clock signal CK_1 that is at the high level.

In this manner, the driving process of the scanning lines performed by the scan driving circuit in the present preferred embodiment can be complete.

The scan driving circuit in the first embodiment conducts a driving operation for driving a latch module by a first cascade signal and a second cascade signal that are opposite in phase, so that a clock signal is not required to be processed with a phase inversion and thereby the whole scan driving circuit has a less dynamic power consumption.

Figure 4:
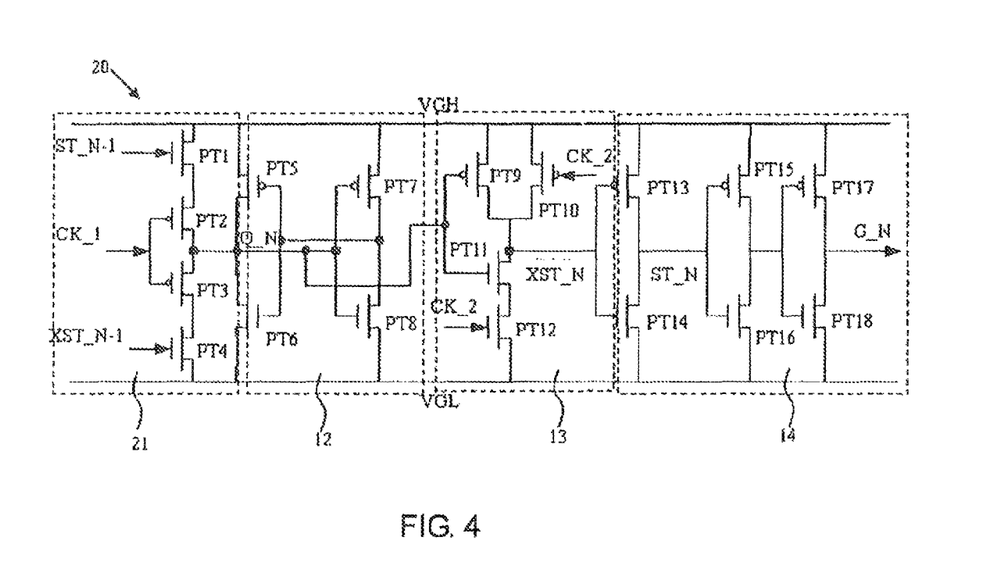
FIG. 4 is a schematic diagram of a scan driving circuit in accordance with the second embodiment of the present invention.

Refer to FIG. 4, which is a schematic diagram of a scan driving circuit in accordance with the second embodiment of the present invention. On the basis of the first embodiment, a first switching transistor PT1 and a second switching transistor PT2 of an input control module 21 of a scan driving circuit 20 in the second embodiment are NMOS transistors while the third switching transistor PT3 and the fourth switching transistor PT4 of the input control module are PMOS transistors. The control terminal of the first switching transistor PT1 is inputted with a first cascade signal of the preceding stage ST_N−1, and the control terminal of the fourth switching transistor PT4 is inputted with a second cascade signal of the preceding stage XST_N−1. The control terminal of a second switching transistor PT2 is inputted with a first clock signal of the current stage CK_1, and the control terminal of a third switching transistor PT3 is also inputted with the first clock signal of the current stage CK_1. The first clock signal of the current stage CK_1 in the second embodiment has an opposite phase to the first clock signal in the first embodiment, and the second embodiment can achieve the same technical effect as does the first embodiment. Simultaneously, the second embodiment can effectively reduce the capacitive coupling effect as the scan driving current in operation because NMOS transistors and PMOS transistors have complementary characteristics.

Specifically, the description of operating fundamentals about the scan driving circuit of the second embodiment is the same as or similar to those described above in the first embodiment; refer to the related description of the first embodiment for specific details.

Therefore, the scan driving circuit of the second embodiment further enhances the reliability and stability of the scan driving circuit based on the first embodiment.

Figure 5:
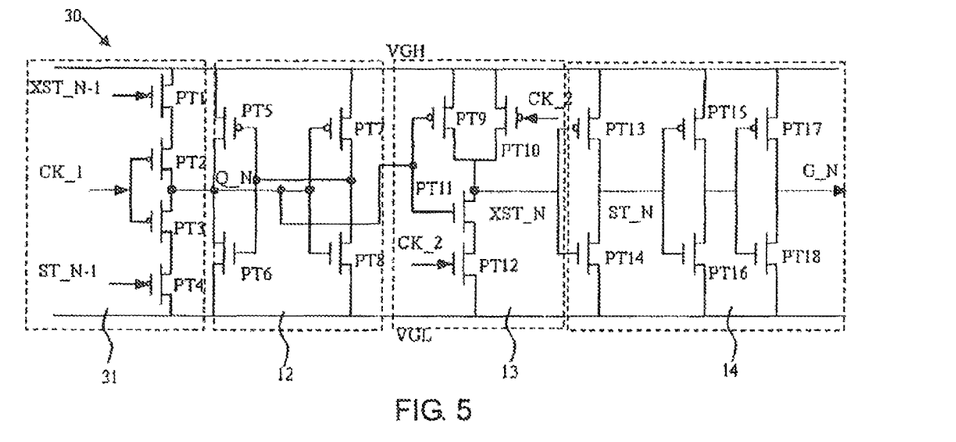
FIG. 5 is a schematic diagram of a scan driving circuit in accordance with the third embodiment of the present invention.

Refer to FIG. 5, which is a schematic diagram of a scan driving circuit in accordance with the third embodiment of the present invention. On the basis of the first embodiment, a first switching transistor PT1, a second switching transistor PT2, a third switching transistor PT3, and a fourth switching transistor PT4 of an input control module 31 of a scan driving circuit 30 in the third embodiment are all PMOS transistors. The control terminal of the first switching transistor PT1 is inputted with a second cascade signal of the preceding stage XST_N−1, and the control terminal of the fourth switching transistor PT4 is inputted with a first cascade signal of the preceding stage ST_N−1. The control terminal of a second switching transistor PT2 is inputted with a first clock signal of the current stage CK_1, and the control terminal of a third switching transistor PT3 is also inputted with the first clock signal of the current stage CK_1. The first clock signal of the current stage CK_1 in the third embodiment has a phase opposite that of the first clock signal in the first embodiment, and the third embodiment can achieve the same technical effect as that of the first embodiment. Simultaneously, the third embodiment can effectively reduce the capacitive coupling effect as the scan driving current in operation because NMOS transistors and PMOS transistors have complementary characteristics.

Specifically, the description of operating fundamentals of the scan driving circuit of the second embodiment is the same as or similar to those described above in the first embodiment; refer to the related description of the first embodiment for specific details.

Therefore, the scan driving circuit of the third embodiment further enhances the reliability and stability of the scan driving circuit based on the first embodiment.

Figure 6:
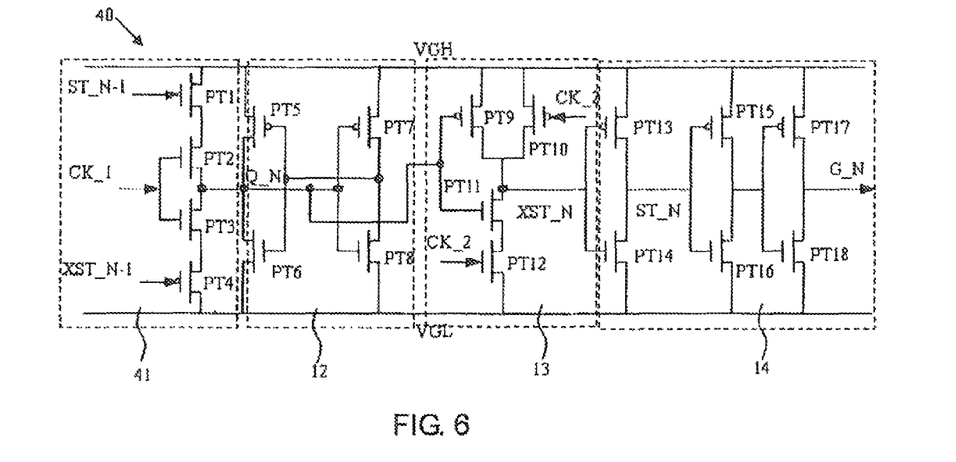
FIG. 6 is a schematic diagram of a scan driving circuit in accordance with the fourth embodiment of the present invention.

Refer to FIG. 6, which is a schematic diagram of a scan driving circuit in accordance with the fourth embodiment of the present invention. On the basis of the first embodiment, a first switching transistor PT1 and a second switching transistor PT2 of an input control module 41 of a scan driving circuit 40 in the fourth embodiment are PMOS transistors while the third switching transistor PT3 and the fourth switching transistor PT4 of the input control module are NMOS transistors. The control terminal of the first switching transistor PT1 is inputted with a second cascade signal of the preceding stage XST_N−1, and the control terminal of the fourth switching transistor PT4 is inputted with a first cascade signal of the preceding stage ST_N−1. The control terminal of a second switching transistor PT2 is inputted with a first clock signal of the current stage CK_1, and the control terminal of a third switching transistor PT3 is also inputted with the first clock signal of the current stage CK_1. The first clock signal of the current stage CK_1 in the fourth embodiment has an identical phase to the first clock signal in the first embodiment, and the second embodiment can achieve the same technical effect as that of the first embodiment. Simultaneously, the fourth embodiment can effectively reduce the capacitive coupling effect as the scan driving current in operation because NMOS transistors and PMOS transistors have complementary characteristics.

Specifically, the description of operating fundamentals of the scan driving circuit of the second embodiment is the same as or similar to those described above in the first embodiment; refer to the related description of the first embodiment for specific details.

Therefore, the scan driving circuit of the fourth embodiment further enhances the reliability and stability of the scan driving circuit based on the first embodiment.

The scan driving circuit of the present invention conducts a driving operation for driving a latch module by a first cascade signal and a second cascade signal, which are opposite in phase, so that a clock signal is not required to be processed with a phase inversion, and thereby the overall volume of a scan driving circuit is reduced. Furthermore, the scan driving circuit has a less overall power consumption. As a result, the existing technical problems of a scan driver circuit such as larger volume and larger dynamic power consumption can be solved.

In summary, while the present invention has been described with the aforementioned preferred embodiments, it is preferable that the descriptions relating to the above embodiments should be construed as exemplary rather than as limiting of the present invention. One of ordinary skill in the art can make a variety of modifications and variations without departing from the spirit and scope of the present invention as defined by the following claims.

What is claimed is:

1. A scan driving circuit configured for driving cascaded scan lines, the scan driving circuit comprising:
    an input control module inputted with a first clock signal of a current stage and cascade signals of a preceding stage, and for generating a control signal based on the first clock signal of the current stage and the cascade signals of the preceding stage;
    a latch module for performing a latch operation for the control signal;
    a driving-signal generation module for generating a driving signal based on the control signal and a second clock signal of the current stage;
    an output control module for outputting a scanning signal of the current stage and a cascade signal of the current stage based on the driving signal;
    a high gate voltage source for supplying a high voltage; and
    a low gate voltage source for supplying a low voltage;
    wherein the cascade signals include a first cascade signal and a second cascade signal that are opposite in phase;
    wherein the input control module comprises a first switching transistor, a second switching transistor, a third switching transistor, and a fourth switching transistor;
    a control terminal of the first switching transistor is inputted with a first cascade signal of the preceding stage, an input terminal of the first switching transistor is connected to the high gate voltage source, and an output terminal of the first switching transistor is connected to an input terminal of the second switching transistor;
    a control terminal of the second switching transistor is inputted with the first clock signal of the current stage, and an output terminal of the second switching transistor is respectively connected to an input terminal of the third switching transistor and an output terminal of the control signal;
    a control terminal of the third switching transistor is inputted with the first clock signal of the current stage, and an output terminal of the third switching transistor is connected to an output terminal of the fourth switching transistor;
    a control terminal of the fourth switching transistor is inputted with a second cascade signal of the preceding stage, and an input terminal of the fourth switching transistor is connected to the low gate voltage source;
    wherein the latch module comprises a fifth switching transistor, a sixth switching transistor, a seventh switching transistor, and an eighth switching transistor;
    an input terminal of the fifth switching transistor is connected to the high gate voltage source, and an output terminal of the fifth switching transistor is connected to the output terminal of the control signal, a control terminal of the sixth switching transistor is connected to the control terminal of the fifth switching transistor, an input terminal of the sixth switching transistor is connected to the low gate voltage source, and an output terminal of the sixth switching transistor is connected to the output terminal of the control signal;

a control terminal of the seventh switching transistor is connected to the output terminal of the control signal, an input terminal of the seventh switching transistor is connected to the high gate voltage source, and an output terminal of the seventh switching transistor is connected to the control terminal of the fifth switching transistor; and a control terminal of the eighth switching transistor is connected to the output terminal of the control signal, an input terminal of the eighth switching transistor is connected to the low gate voltage source, and an output terminal of the eighth switching transistor is connected to the control terminal of the fifth switching transistor;

wherein the fifth switching transistor and the seventh switching transistor are PMOS transistors, and the sixth switching transistor and the eighth switching transistor are NMOS transistors.

2. The scan driving circuit according to claim 1, wherein the first cascade signal of the preceding stage inputted to the scan driving circuit of the first stage is a start signal, and the second cascade signal of the preceding stage inputted to the scan driving circuit of the first stage is a phase-inverted signal of the start signal.

3. The scan driving circuit according to claim 1, wherein the driving-signal generation module comprises a ninth switching transistor, a tenth switching transistor, an eleventh switching transistor, and a twelfth switching transistor;

a control terminal of the ninth switching transistor is connected to an output terminal of the latch module, an input terminal of the ninth switching transistor is connected to the high gate voltage source, and an output terminal of the ninth switching transistor is connected to an output terminal of the driving-signal generation module;

a control terminal of the tenth switching transistor is inputted with the second clock signal of the current stage, an input terminal of the tenth switching transistor is connected to the high gate voltage source, and an output terminal of the tenth switching transistor is connected to an output terminal of the driving-signal generation module;

a control terminal of the eleventh switching transistor is connected to the output terminal of the latch module, an input terminal of the eleventh switching transistor is connected to an output terminal of the twelfth switching transistor, and an output terminal of the eleventh switching transistor is connected to the output terminal of the driving-signal generation module; and a control terminal of the twelfth switching transistor is inputted with the second clock signal of the current stage, and an input terminal of the twelfth switching transistor is connected to the low gate voltage source;

wherein the ninth switching transistor and the tenth switching transistor are PMOS transistors, and the eleventh switching transistor and the twelfth switching transistor are NMOS transistors.

4. The scan driving circuit according to claim 3, wherein the output terminal of the driving-signal generation module outputs a driving signal of the current stage, which is also the second cascade signal of the current stage.

5. The scan driving circuit according to claim 1, wherein the output control module comprises a thirteenth switching transistor, a fourteenth switching transistor, a fifteenth switching transistor, a sixteenth switching transistor, a seventeenth switching transistor, and an eighteenth switching transistor;

a control terminal of the thirteenth switching transistor is connected to an output terminal of the drive signal generation module, an input terminal of the thirteenth switching transistor is connected to the high gate voltage source, and an output terminal of the thirteenth switching transistor is respectively connected to a control terminal of the fifteenth switching transistor and a control terminal of the sixteenth switching transistor;

a control terminal of the fourteenth switching transistor is connected to the output terminal of the driving-signal generation module, an input terminal of the fourteenth switching transistor is connected to the low gate voltage source, and an output terminal of the fourteenth switching transistor is respectively connected to a control terminal of the fifteenth switching transistor and a control terminal of the sixteenth switching transistor;

an input terminal of the fifteenth switching transistor is connected to the high gate voltage source, and an output terminal of the fifteenth switching transistor is respectively connected to a control terminal of the seventeenth switching transistor and a control terminal of the eighteenth switching transistor;

an input terminal of the sixteenth switching transistor is connected to the low gate voltage source, and an output terminals of the sixteenth switching transistor is respectively connected to a control terminal of the seventeenth switching transistor and a control terminal of the eighteenth switching transistor;

an input terminal of the seventeenth switching transistor is connected to the high gate voltage source, and an output terminal of the seventeenth switching transistor is connected to an output terminal of the output control module; and an input terminal of the eighteenth switching transistor is connected to a low gate voltage source, and an output terminal of the eighteenth switching transistor is connected to the output terminal of the output control module;

wherein the thirteen switching transistor, the fifteenth switching transistor, and the seventeenth switching transistor are PMOS transistors, and the fourteenth switching transistor, the sixteenth switching transistor, and the eighteenth switching transistor are NMOS transistors.

6. The scan driving circuit according to claim 5, wherein the output terminal of the thirteenth switching transistor outputs the first cascade signal of the current stage.

7. The scan driving circuit according to claim 1, wherein the first switching transistor, the second switching transistor, the third switching transistor, and the fourth switching transistor are all NMOS transistors or PMOS transistors.

8. The scan driving circuit according to claim 1, wherein the first switching transistor and the fourth switching transistor are both NMOS transistors, and the second switching transistor and the third switching transistor are both PMOS transistors.

9. The scan driving circuit according to claim 1, wherein the first switching transistor and the fourth switching transistor are both PMOS transistors, and the second switching transistor and the third switching transistor are both NMOS transistors.

10. A scan driving circuit configured for driving cascaded scan lines, the scan driving circuit comprising:
an input control module being inputted with a first clock signal of a current stage and cascade signals of a preceding stage, and for generating a control signal based on the first clock signal of the current stage and the cascade signals of the preceding stage;
a latch module for performing a latch operation for the control signal;
a driving-signal generation module for generating a driving signal based on the control signal and a second clock signal of the current stage;
an output control module for outputting a scanning signal of the current stage and a cascade signal of the current stage based on the driving signal;
a high gate voltage source for supplying a high voltage; and
a low gate voltage source for supplying a low voltage, wherein the latch module is connected between the input control module and the driving-signal generation module and includes a plurality of switching transistors.

11. The scan driving circuit according to claim 10, wherein the cascade signals include a first cascade signal and a second cascade signal that are opposite in phase;
the input control module comprises a first switching transistor, a second switching transistor, a third switching transistor, and a fourth switching transistor;
a control terminal of the first switching transistor is inputted with a first cascade signal of the preceding stage, an input terminal of the first switching transistor is connected to the high gate voltage source, and an output terminal of the first switching transistor is connected to an input terminal of the second switching transistor;
a control terminal of the second switching transistor is inputted with the first clock signal of the current stage, and an output terminal of the second switching transistor is respectively connected to an input terminal of the third switching transistor and an output terminal of the control signal;
a control terminal of the third switching transistor is inputted with the first clock signal of the current stage, and an output terminal of the third switching transistor is connected to an output terminal of the fourth switching transistor; and
a control terminal of the fourth switching transistor is inputted with a second cascade signal of the preceding stage, and an input terminal of the fourth switching transistor is connected to the low gate voltage source.

12. The scan driving circuit according to claim 11, wherein the first cascade signal of the preceding stage inputted to the scan driving circuit of the first stage is a start signal, and the second cascade signal of the preceding stage inputted to the scan driving circuit of the first stage is a phase-inverted signal of the start signal.

13. The scan driving circuit according to claim 10, wherein the latch module comprises a fifth switching transistor, a sixth switching transistor, a seventh switching transistor, and an eighth switching transistor;
an input terminal of the fifth switching transistor is connected to the high gate voltage source, and an output terminal of the fifth switching transistor is connected to the output terminal of the control signal;
a control terminal of the sixth switching transistor is connected to the control terminal of the fifth switching transistor, an input terminal of the sixth switching transistor is connected to the low gate voltage source, and an output terminal of the sixth switching transistor is connected to the output terminal of the control signal;
a control terminal of the seventh switching transistor is connected to the output terminal of the control signal, an input terminal of the seventh switching transistor is connected to the high gate voltage source, and an output terminal of the seventh switching transistor is connected to the control terminal of the fifth switching transistor; and
a control terminal of the eighth switching transistor is connected to the output terminal of the control signal, an input terminal of the eighth switching transistor is connected to the low gate voltage source, and an output terminal of the eighth switching transistor is connected to the control terminal of the fifth switching transistor; and
wherein the fifth switching transistor and the seventh switching transistor are PMOS transistors, and the sixth switching transistor and the eighth switching transistor are NMOS transistors.

14. The scan driving circuit according to claim 10, wherein the driving-signal generation module comprises a ninth switching transistor, a tenth switching transistor, an eleventh switching transistor, and a twelfth switching transistor;
a control terminal of the ninth switching transistor is connected to an output terminal of the latch module, an input terminal of the ninth switching transistor is connected to the high gate voltage source, and an output terminal of the ninth switching transistor is connected to an output terminal of the driving-signal generation module;
a control terminal of the tenth switching transistor is inputted with the second clock signal of the current stage, an input terminal of the tenth switching transistor is connected to the high gate voltage source, and an output terminal of the tenth switching transistor is connected to an output terminal of the driving-signal generation module;
a control terminal of the eleventh switching transistor is connected to the output terminal of the latch module, an input terminal of the eleventh switching transistor is connected to an output terminal of the twelfth switching transistor, and an output terminal of the eleventh switching transistor is connected to the output terminal of the driving-signal generation module; and
a control terminal of the twelfth switching transistor is inputted with the second clock signal of the current stage, and an input terminal of the twelfth switching transistor is connected to the low gate voltage source;
wherein the ninth switching transistor and the tenth switching transistor are PMOS transistors, and the eleventh switching transistor and the twelfth switching transistor are NMOS transistors.

15. The scan driving circuit according to claim 14, wherein the output terminal of the driving-signal generation module outputs a driving signal of the current stage, which is also the second cascade signal of the current stage.

16. The scan driving circuit according to claim 10, wherein the output control module comprises a thirteenth switching transistor, a fourteenth switching transistor, a fifteenth switching transistor, a sixteenth switching transistor, a seventeenth switching transistor, and an eighteenth switching transistor;
a control terminal of the thirteenth switching transistor is connected to an output terminal of the drive signal generation module, an input terminal of the thirteenth switching transistor is connected to the high gate voltage source, and an output terminal of the thirteenth switching transistor is respectively connected to a control terminal of the fifteenth switching transistor and a control terminal of the sixteenth switching transistor;

a control terminal of the fourteenth switching transistor is connected to the output terminal of the driving-signal generation module, an input terminal of the fourteenth switching transistor is connected to the low gate voltage source, and an output terminal of the fourteenth switching transistor is respectively connected to a control terminal of the fifteenth switching transistor and a control terminal of the sixteenth switching transistor;

an input terminal of the fifteenth switching transistor is connected to the high gate voltage source, and an output terminal of the fifteenth switching transistor is respectively connected to a control terminal of the seventeenth switching transistor and a control terminal of the eighteenth switching transistor;

an input terminal of the sixteenth switching transistor is connected to the low gate voltage source, and an output terminal of the sixteenth switching transistor is respectively connected to a control terminal of the seventeenth switching transistor and a control terminal of the eighteenth switching transistor;

an input terminal of the seventeenth switching transistor is connected to the high gate voltage source, and an output terminal of the seventeenth switching transistor is connected to an output terminal of the output control module; and an input terminal of the eighteenth switching transistor is connected to a low gate voltage source, and an output terminal of the eighteenth switching transistor is connected to the output terminal of the output control module;

wherein the thirteen switching transistor, the fifteenth switching transistor, and the seventeenth switching transistor are PMOS transistors, and the fourteenth switching transistor, the sixteenth switching transistor, and the eighteenth switching transistor are NMOS transistors.

17. The scan driving circuit according to claim 16, wherein the output terminal of the thirteenth switching transistor outputs the first cascade signal of the current stage.

18. The scan driving circuit according to claim 16, wherein the first switching transistor, the second switching transistor, the third switching transistor, and the fourth switching transistor are all NMOS transistors or PMOS transistors.

19. The scan driving circuit according to claim 11, wherein the first switching transistor and the fourth switching transistor are both NMOS transistors, and the second switching transistor and the third switching transistor are both PMOS transistors.

20. The scan driving circuit according to claim 11, wherein the first switching transistor and the fourth switching transistor are both PMOS transistors, and the second switching transistor and the third switching transistor are both NMOS transistors.

* * * * *